(12) United States Patent
Chiaretti

(10) Patent No.: US 6,967,984 B2
(45) Date of Patent: Nov. 22, 2005

(54) EXTERNAL CAVITY LASER

(75) Inventor: Guido Chiaretti, Novate Milanese (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 197 days.

(21) Appl. No.: 10/303,669

(22) Filed: Nov. 22, 2002

(65) Prior Publication Data

US 2003/0179799 A1 Sep. 25, 2003

Related U.S. Application Data

(63) Continuation-in-part of application No. PCT/EP01/01677, filed on Feb. 15, 2001.

(30) Foreign Application Priority Data

May 24, 2000 (IT) .................................. PCT/IT00/00212

(51) Int. Cl.$^7$ .................................................. H01S 3/08
(52) U.S. Cl. ........................... 372/92; 372/102; 372/42; 372/43
(58) Field of Search ............................. 372/92, 102, 43

(56) References Cited

U.S. PATENT DOCUMENTS 5,845,030 A * 12/1998 Sasaki et al. .................. 385/88
5,993,073 A * 11/1999 Hamakawa et al. ........... 385/88
6,310,997 B1 * 10/2001 Kato et al. ..................... 385/37

FOREIGN PATENT DOCUMENTS

EP   0 949 729 A   10/1999
WO   PCT/EP01/01877   7/2001

OTHER PUBLICATIONS

Paoletti, R. et al. "1.56mm Optical Short Pulse Generation at 10–GHz Repetition Rate, Using a Mode–Locked Hybrid Distributed Bragg Reflector (ML–HDBR) Laser Source", IEEE Photonics Technology Letters, IEEE Inc. New York, US. vol. 12, No. 3, Mar. 2000, pp. 245–247.

Giles, C.R. "Lightwave Applications of Fiber Bragg Gratings", Journal of Lightwave Technology, IEEE, New York, US. vol. 16, No. 8, Aug. 1, 1997, pp. 1391–1404.

Paoletti, R. et al. "15–GHz Modulation Bandwidth, Ultra-tow–Chip 1.56–mm Directly Modulated Hybrid Distributed Bragg Reflector (HDBR) Laser Source", IEEE Photonics Technology Letters, IEEE Inc. New York, US. vol. 10, No. 12, Dec. 1998, pp. 1691–1693.

* cited by examiner

*Primary Examiner*—Minsun Oh Harvey
*Assistant Examiner*—Dung (Michael) T. Nguyen
(74) *Attorney, Agent, or Firm*—Lisa K. Jorgenson; Bryan A. Santarelli; Graybeal Jackson Haley LLP

(57) ABSTRACT

External cavity laser with reflector in optical wave guide, particularly HDBR laser, with an active element comprising a semiconductor optical amplifying cavity having a low-reflectivity facet (3), for example a Semiconductor Optical Amplifier (SOA) with a facet (30) opposite to said low-reflectivity facet treated with a reflecting coating, or a Fabry-Perot laser, and an external reflector comprising a Bragg grating (70) formed in an optical wave guide (4) near a termination (5), facing said facet, of a segment (5, 6, 7) of said optical wave guide coupled with the facet. The grating has a spatial profile of modulation of the refraction index such that a corresponding optical reflectivity spectrum (A) has an optical bandwidth (W) sufficiently small around a prescribed laser oscillation mode wavelength ($\gamma c$) for the laser to oscillate only on the prescribed mode and not on other oscillation modes even in conditions of high-frequency direct modulation.

16 Claims, 4 Drawing Sheets

EXTERNAL CAVITY LASER

PRIORITY CLAIM

This is a continuation-in-part application which claims priority from PCT/EP01/01677, published in English, filed Feb. 15, 2001, based on International Application No. PCT/IT00/00212, filed May 24, 2000; this application also claims priority from International Application No. PCT/IT00/00212, filed May 24, 2000. Both of these applications are incorporated herein by reference.

FIELD OF THE INVENTION

The present invention relates to a laser of the type having an external cavity, with a reflector formed in an optical wave guide, for instance an optical fibre. Such type of laser is also known as "Fiber Grating Laser" or "Hybrid Distributed Bragg Reflector" ("HDBR") laser.

BACKGROUND OF THE INVENTION

It is known in technical literature that HDBR lasers are generally formed by an active element, comprising a semiconductor chip in which a Fabry-Perot semiconductor laser diode, or a Semiconductor Optical Amplifier (SOA), is integrated, and a reflector. A facet of the laser diode or, respectively, of the SOA, facing a tip or termination of an optical fibre to which the active element is coupled, is coated with a layer of anti-reflection material. The other facet of the laser diode chip, respectively the SOA, opposite to that facing the fibre termination, is conventionally coated with a layer of reflective material. The reflector comprises a Bragg grating, formed in said optical fibre.

Such lasers generally have a rather pure Continuous Wave ("CW") emission spectrum, and are mainly used as laser pumps for optical amplifiers. A review of the possible applications of this type of laser is provided in C. R. Giles, "Lightwave Applications of Fiber Bragg Grating", Journal of Lightwave Technology Vol. 15, No. 8, August 1997, pages 1391 and following.

The main features of this type of laser depends on the overall cavity length, given by the distance between the facet of the active element coated with the reflecting material and the position, along the fibre, of the equivalent mirror of the Bragg grating. The overall cavity length is thus given by the sum of the active element length, the distance between the active element facet coated with the anti-reflecting material and the fibre termination faced thereto, and the distance between the fibre termination and the position, along the fibre, of the equivalent mirror of the Bragg grating. Such a position is located at the point, in the grating, from where the photons that are reflected towards the active element have a time of flight equal to that of the photons sent by the active element towards the grating; in other words, the position of the equivalent mirror is the position wherein a mirror would have to be positioned in order that a pulse sent by a light source and reflected by the mirror returns to the source in the same time the pulse sent into the grating would take to return.

Since in general the width of the modulation band (modulation bandwidth) of a laser depends on the time of flight of the photons within the cavity of the laser, and since the time of flight of the photons within the cavity increases with the cavity length, a relation exists between the cavity length and the laser modulation bandwidth: the lower the cavity length, the higher the laser modulation bandwidth.

As regards HDBR lasers, for the very reason that the cavity is external to the active element, so that the cavity length is rather high compared to other types of laser, an existing technical prejudice wants that these lasers can advantageously be used in CW applications, but not in applications wherein the possibility of directly modulating the laser is to be contemplated; this because the laser modulation bandwidth, for the above considerations on the cavity length, would be always narrow and it would not be possible to reach modulation frequencies of interest for the current applications.

In accordance with such a technical prejudice, EP-A-0 949 729 confirms that the main parameter for realizing an HDBR laser for direct modulation is the length of the laser cavity. In that patent application, with the aim of demonstrating the feasibility of operating external cavity lasers not only in CW, but also in direct modulation, a solution is proposed that allows for reducing the cavity length. To such purpose, it is suggested to realize, in the optical fibre coupled with the active element, gratings having a half-gaussian or anyhow asymmetric spatial profile of modulation of the refractive index longitudinally to the fibre. In this way, according to the teachings provided, the equivalent mirror of the grating can be positioned sufficiently close to the fibre termination which is optically coupled to the active element.

In the case described in such patent application, the position of the equivalent mirror of the grating can actually be made close, approximately 2 mm, to the fibre termination coupled to the laser diode. On the other hand, in the same document it is shown that the distance of the equivalent mirror from the fibre termination is heavily affected by the length of the fibre portion, approximately 3 mm, concerned by the attachment of the fibre termination in front of the laser: the Bragg grating can in fact-be formed only downstream of said fibre portion, the length of which cannot be reduced below a given limit due to the fact that, for the attachment, resins are used. The overall cavity length thus results to be approximately 5 mm.

With such a laser cavity length value, in the above mentioned patent application it is stated that the upper limit to the laser modulation bandwidth is approximately equal to 14 GHz.

However, experiments conducted by the Applicant of the present patent application evidenced that such an upper limit is merely theoretical being related to small signal modulation, since it does not take into account factors which are instead essential for having a good quality of transmission, such as the laser mode stability when the laser is directly modulated with NRZ modulation format.

Laser mode stability is essential in applications in the field of digital communication systems, in which it is of paramount importance to have a very low transmission bit error rate. In such application field it is in fact absolutely necessary to guarantee a Bit Error Rate ("BER") not higher than $10^{-9}$ or $10^{-10}$, and in the design phase it is aimed at guaranteeing an even lower BER, ranging from $10^{-12}$ and $10^{-14}$.

The same experiments previously mentioned have instead proven that, using a spatially asymmetric, e.g. half-gaussian, grating as proposed in the above mentioned patent application, the maximum frequency of direct NRZ modulation format of the laser which allows to comply with the low BER requirement is not higher than approximately 1 Gbit/sec. Therefore, the laser cavity structure proposed in such European patent application allows to obtain a laser with high spectral purity, that can also be directly modulated in real conditions, but with the constraint that the maximum bit rate of direct modulation does not exceed 1 Gbit/sec.

Such a bit rate, considerable in absolute sense, does not however coincide with any of the values prescribed by the standard SDH ("Synchronous Digital Hierarchy") or the U.S. counterpart SONET. For example, the SDH standard prescribes bit rate values which are multiple of four times of a base frequency of approximately 155 MHz (thus, 622 MHz, 2.5 GHz, 10 GHz and so on).

It is of paramount interest to have a laser with high spectral purity, that can be directly modulated at high bit rate still remaining stable in wavelength, that is, without errors in the transmission. In particular, in view of the requirements prescribed by the SDH or SONET standards, it is of the outmost interest to have a laser that can be directly modulated at a bit rate of at least 2.5 Gbit/sec, or multiple of four times thereof.

SUMMARY OF THE INVENTION

These problems are solved, and the deep-rooted technical prejudice overcome, by the laser according to the present invention, in which the external cavity, of sufficiently small length so as to be capable of sustaining high modulation frequencies, is obtained by means of a grating, formed in an optical waveguide, particularly but not exclusively an optical fibre. The grating has a spatial profile of modulation of the refraction index such that the optical reflectivity spectrum has a spectral width sufficiently small around a prescribed laser oscillation mode (fundamental mode) wavelength for the laser to oscillate only on said prescribed mode even in conditions of high-frequency direct modulation. The other oscillation modes (secondary modes) of the laser, adjacent the fundamental mode, are attenuated to an extent sufficient for the laser not to jump onto any one of them, even in condition of direct modulation at high frequency.

In this way, the phenomenon known as "Mode Jumping Noise" ("MJN") is prevented. This phenomenon is due to the fact that the laser does not stably oscillate on one mode only (the fundamental one), but jumps between the fundamental mode and one of the first secondary modes adjacent thereto.

Digital transmission thus results to be free of errors, even for high bit rates.

BRIEF DESCRIPTION OF THE DRAWINGS

The features and advantages of the present invention will be better understood by reading the following detailed description of some possible practical embodiments thereof, provided merely by way of example making reference to the annexed drawings, wherein:

FIG. 5 is a diagram (obtained experimentally by means of a spectrum analyser) showing the amplitude (A, in dBm) of the laser output radiation as a function of the wavelength ($\lambda$, in nm) in direct modulation conditions at 2.5 GHz, while FIG. 6 shows the power (P, in mW) of the laser output radiation as a function of the laser drive current (I, in mA);

DETAILED DESCRIPTION OF THE PREFERRED EMBODIMENT

Figure 1:
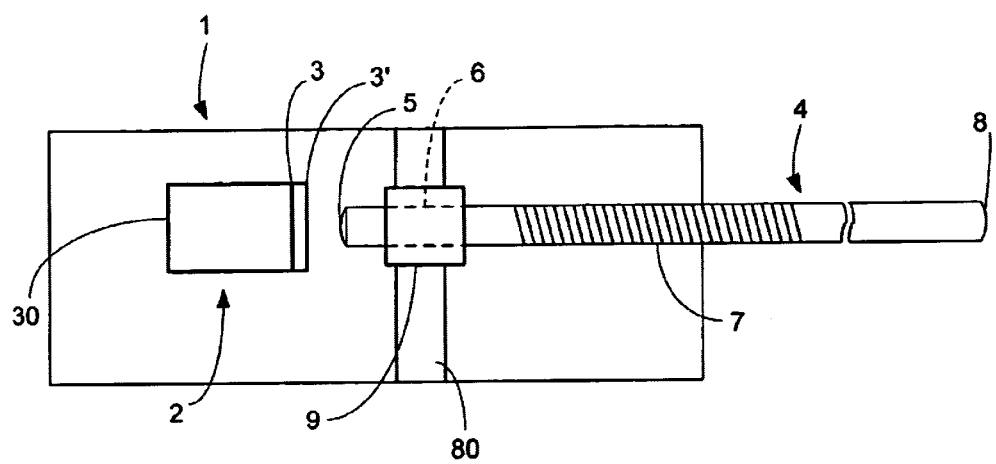
FIG. 1 is a schematic view of a laser according to a possible practical embodiment of the present invention.

In order to understand the real inventive contribute to the prior art, it is worth making the following foreword.

As previously mentioned, there exists a technical prejudice against the use of external cavity lasers in applications requiring the direct modulation thereof, particularly at high frequencies such as for example applications in the field of high bit rate digital transmissions.

Such a technical prejudice is rooted from one hand in the relation known to hold between the laser cavity length and the modulation bandwidth thereof: according to such a relation, the longer the laser cavity, the narrower the laser modulation band. From the other hand, the above prejudice is rooted in the fact that external cavity lasers have a cavity intrinsically long, and consequently they have an intrinsically narrow modulation bandwidth that makes the use of such lasers not interesting for applications different from those in CW, for example as pump lasers for optical amplifiers.

The teaching of EP-A-0 949 729, far from rebut such a technical prejudice, is directed to realizing an external cavity laser in which the cavity length can be made sufficiently small for the laser to have a wider modulation bandwidth. According to such a teaching, the cavity length can be reduced if a Bragg grating is formed having an asymmetric spatial profile of modulation of the refraction index, for example half-gaussian. With such a grating, the position of the equivalent mirror of the grating is offset towards one end of the grating. The distance from the fibre termination of the equivalent mirror of the grating can thus be kept small, and the laser modulation bandwidth consequently increased to the extent that the use of external cavity lasers is made possible also in applications providing for a direct modulation thereof.

In other words, the technical prejudice existing in the prior art ascribes importance to the total cavity length only, and so to the position along the fibre of the equivalent mirror of the Bragg grating. Still in other words, the prior art merely ascribed importance to the spatial shape of the Bragg grating, that is to the spatial profile of modulation of the refractive index formed along the fibre.

The Applicants of the present patent application have the merit of having instead realized that, contrary to the existing technical prejudice, conventional external cavity lasers are not suitable for the use in applications providing for a direct modulation thereof at high frequencies, more than due to a limitation deriving from the cavity length thereof (which actually would allow a modulation frequency of several Gbits/sec), for the fact that fibre gratings of the known types, included the asymmetric ones suggested in the aforementioned European patent application, do not allow to have a stable spectrum of the laser output optical radiation in conditions of direct modulation at more than approximately one Gbit/sec.

It happens in fact that, for direct modulation frequencies (i.e., for bit rates) higher than approximately 1 Gbit/sec, due to the mode jumping of the laser optical spectrum between different oscillation modes, one or more secondary oscillation modes of the laser enters into the spectrum, initially very pure, widening it and, consequently, causing a series of errors that cannot be accepted in view of the standard degree of quality required for this kind of transmission.

In other words, for high bit rates the laser optical spectrum becomes unstable so that the transition between different modes causes false transitions in the transmitted signal; these false transitions, being interpreted by a receiver device as true signal transitions, are cause of noise (Mode Jumping Noise) and, consequently, of errors.

Consequently, according to the invention, for the laser to not only have a wide modulation band but also to be stable when it is directly modulated at high frequencies, it is a necessary, but not sufficient condition that the cavity length be sufficiently small, and thus that the Bragg grating have a spatial profile such that the equivalent mirror is positioned near the optical fibre termination. However, this condition is only necessary, not sufficient. Another condition to be met is that the reflectivity amplitude spectrum of the grating, that is the transformed function in the optical frequency domain of the transfer function associated with the grating, has a bandwidth such that only a prescribed oscillation mode (the fundamental mode) is not attenuated, while the secondary modes, starting from the modes immediately adjacent the fundamental mode, are attenuated at least to an extent sufficient for them not to cause problems of laser instability at the bit rate desired (in the sense that the laser must not switch between different modes).

It is therefore essential that, in the frequency domain, the transformed function of the grating transfer function be as narrow as possible around the frequency corresponding to the fundamental mode, so that already at frequencies corresponding to the immediately adjacent secondary modes, the transfer function introduces an attenuation sufficiently high to prevent the laser from oscillating on such secondary modes.

The transformed function in the frequency domain of the grating transfer function should thus ideally be a δ of Dirac. To achieve this result, it is necessary to have the contribution of an infinite number of harmonics. From this stems the requirement that the spatial profile of the grating be symmetric, since an interrupted, asymmetric profile, as suggested in the cited European patent application, goes in the opposite direction, lacking of the contribute of half of the harmonics.

Made this foreword, a possible practical embodiment of the invention will be now described.

With reference to FIG. 1, a preferred embodiment of a HDBR laser according to the invention is shown.

The laser of FIG. 1 comprises a support 1, for example of silicon, housing a laser diode 2, attached thereto, in turn formed in a semiconductor material chip. The laser diode 2, known per-se, is for example comprised of a P-N junction formed on a GaAs or InP substrate, or alternatively an hetero-junction such as InP/InGaAsP. By way of example, a GaAs laser can be used in applications providing for exploiting the first attenuation window of the optical fibre, corresponding to wavelengths in the range 0.8 to 0.9 μm; a InP/InGaAsP laser can instead operate in the second and third attenuation windows of the optical fibre, corresponding to wavelengths of about 1.3 to 1.55 μm.

The laser diode 2, has a facet 30 properly reflecting and, at the opposite side, an output port 3 for the optical radiation, and it is also provided with electrical terminals (not shown) for applying a bias and modulation current I for the laser diode. The output port 3 of the laser diode 2 comprises a layer 3' of low-reflectivity or anti-reflecting material placed on the respective facet of the chip.

The output port 3 of the laser diode 2 is optically coupled with an optical fibre 4 comprising an input termination 5, a fibre attachment portion 6, a fibre portion 7 in which a Bragg grating is formed, and an output termination 8.

The input 5 of the optical fibre 4 is expediently treated in such a way as to form a lens which, together with a proper alignment, allows to achieve the optical coupling of the output port 3 of the laser diode 2 with the optical fibre 4.

In order to make the length of the input termination 5 as small as possible, the lens is preferably obtained by chemical etching the surface of the fibre termination. In this way the lens occupies a portion of the fibre 4 of the length of few tens of microns. This technique appears to be preferable compared to techniques that call for a mechanical working, or a thermal working, or a working by means of electric-arc discharge.

The fibre 4 is preferably attached to the support 1 by means of a soldering between the fibre portion 6 and the support 1 itself, realized in a region 9 of the support 1. The use of a semiconductor material support 1 allows to attach the fibre 4 by means of soldering and also allows to avoid the use of resins, which would cause problems of instability in the attachment and scarce reliability. Additionally, attaching the fibre by means of soldering allows to keep the length of the portion 6 of fibre 4, necessary for the attachment thereof to the support 1, within approximately 0.5 mm.

Advantageously, for soldering the fibre 4 to the support 1, the fibre 4 is externally metallized in correspondence of the attachment portion 6; on the support 1, in correspondence of region 9, a micro-heater is integrated, for example a resistor 80. After having positioned the fibre in such a way as the attachment portion 6 is placed over region 9, resistor 80 is properly supplied with electrical energy so as to produce by Joule effect the heat necessary for melting a soldering alloy (not shown) that solders the fibre to the support.

The portion 7 of the optical fibre including the Bragg grating has, for example, a length of about 8 mm.

Figure 2:
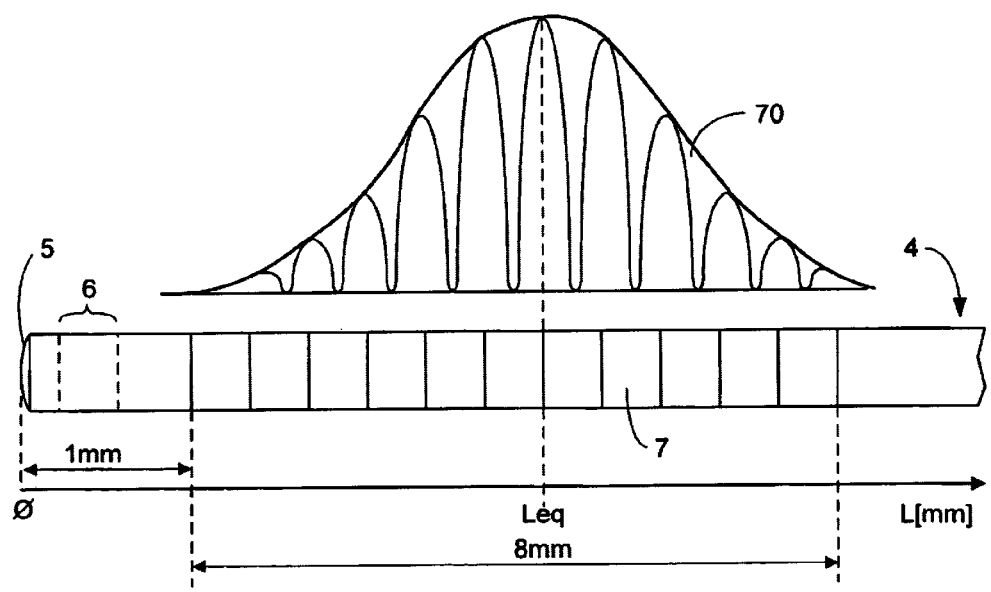
FIG. 2 shows a possible spatial profile of a Bragg grating used in the laser of FIG. 1.

In particular, the spatial profile of modulation of the refraction index of such Bragg grating is symmetric, such as for example a gaussian profile 70 shown schematically in FIG. 2 (analitically represented by the function y÷exp(−x$^2$)) or a lorentzian profile. However, other symmetric profiles can be used, such as for example those represented by the curve y÷sin$^2$(x)

With a Bragg grating having a symmetric spatial profile, the equivalent mirror of the Bragg grating is positioned approximately halfway the length thereof and thus, for the particular example shown, the equivalent mirror is positioned (leq) at approximately 4 mm from the beginning of the portion 7 of the fibre 4. It is to be further noted that the beginning of portion 7 of the fibre 4 is at a distance of less than 1 mm from the fibre portion 6 attached by soldering to region 9 of the support 1.

In total the length of the cavity of the laser of FIG. 1, not considering the length of the laser diode 2 (approximately equal to 200 μm) is about 5.5 mm.

Figure 3:
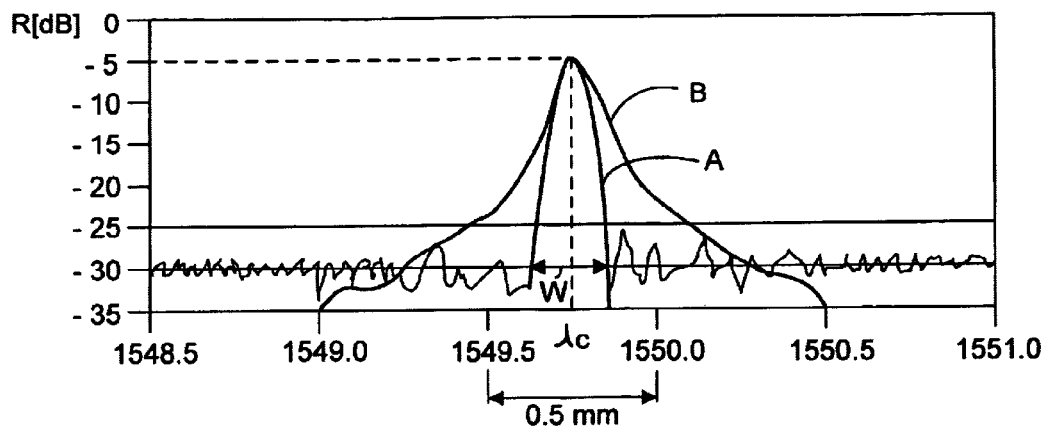
FIG. 3 is a diagram of reflectivity (R, in dB) versus wavelength ($\lambda$, in nm) showing the spectral behaviour of two gratings: in thicker line (curve B) that of a spatially asymmetric grating, according to the prior art, in thinner line (curve A) that of the grating of FIG. 2, used in the laser of FIG. 1.

The transformed function in the frequency domain of the transfer function associated to the Bragg grating formed in the segment 7 of the optical fibre 4 has a reflectivity (R) spectrum shown schematically in FIG. 3, curve A. In greater detail, curve A in FIG. 3 shows the reflectivity R as a function of the radiation wavelength, where the reflectivity R is the ratio, in decibels, of the power of the optical radiation reflected by the grating, $P_R$, to the power of the optical radiation incident onto the grating, $P_I$. Such a spectrum is experimentally obtainable using for example a spectrum analyser.

In the example shown in FIG. 3, the reflectivity spectrum represented by curve A has a peak of reflectivity in correspondence of a wavelength $\lambda c$ equal to approximately 1.55 $\mu$m, and refers to the case of an InP/InGaAsP hetero-junction laser. In correspondence of such a peak, the power, of the radiation reflected by the grating is approximately equal to a value ranging from 20% to 70% of the power the radiation incident onto the grating.

Such a reflectivity peak of the Bragg grating formed in the portion 7 of the optical fibre 4 is in the gain band of the laser diode 2.

Advantageously, the reflectivity spectrum corresponding to curve A has an optical bandwidth W at −25 dB less than 0.5 nm. Thanks to this, it is guaranteed that the laser does not oscillate on the secondary modes, neither on those immediately adjacent the fundamental mode.

As will be evident for the skilled technician, Bragg gratings of the types described above are obtainable using known fabrication techniques.

Such a spectral bandwidth of the Bragg grating allows to filter out the undesired secondary modes and to reach very high bit rates in condition of direct modulation of the laser, for example 2.5 Gbits/sec, assuring at the same time a low BER (Bit Error Rate), particularly lower than $10^{-10}$, that is, without introducing errors during the information transmission. On the contrary, a laser realized in accordance with the teaching provided by EP-A-0 949 729, albeit having an upper theoretical limit of 14 GHz to the modulation band in small-signal condition, cannot be used in high bit rate digital transmission, since it does not properly filter out secondary modes and thus introduces an unacceptable BER, due to transitions between the various oscillation modes (introduction of MJN noise).

By comparison, and to prove what previously stated, curve B in FIG. 3 represents the reflectivity spectrum of a Bragg grating having an asymmetric profile of modulation of the refraction index, for example the half-gaussian one depicted in the above-cited European Patent Application EP-A-0 949 729.

It is to be noted that such a spectrum has lateral lobes and that the respective bandwidth at −25 dB is higher than 0.5 nm. Due to this, when directly modulated the laser results to be unstable, since it does not oscillate stably on the fundamental mode, but switches between the fundamental and the secondary modes. Each transition between modes is interpreted by a receiving apparatus as a real transition of the transmitted signal, and thus introduces errors in the transmission.

For the operation thereof, the laser of FIG. 1 is directly biased in such a way as a constant current I is injected into the corresponding P-N junction. When such a current I exceeds a specified threshold value $I_S$, the diode is capable of generating photons by stimulated emission and so it can work as an active means.

To the laser diode 2 a laser cavity is associated which is limited at one end by the reflecting facet 30 of the laser diode 2 and opposed the output 3 and, at the other end, by the equivalent mirror defined by the Bragg grating formed in the optical fibre 4. Through the lens provided with in correspondence of the fibre termination 5, the optical radiation emitted from the output 3 of the laser diode 2 is conveyed into the fibre 4. This radiation passes through the fibre attachment portion 6 and propagates through portion 7 of the optical fibre 4, where the Bragg grating is formed, and finally reaches the equivalent mirror defined by the Bragg grating itself.

The equivalent mirror reflects a part of such a radiation back towards the laser diode 2, where it causes a stimulated emission of photons, and transmits a remaining part towards the output 8 of the fibre. It should be apparent for the skilled technician that the Bragg grating is designed in such a way as to realise an optical feedback such as to optimise the losses balance, due to the radiation transmitted from the grating towards the output 8, by the radiation amplification in the active medium formed by the laser diode 2.

As a consequence of such a feedback, the power of the optical radiation increases at each passage within the cavity, till when a steady-state condition is reached due to a decrease in the gain of the laser diode 2, due to saturation. In this steady-state condition, the laser of FIG. 1 generates an optical radiation having, for the maximum part, a wavelength $\lambda c$ resulting from the shape of the gain spectrum of the laser diode 2, from the cavity dimensions and from the shape of the reflectivity spectrum of the Bragg grating.

The distribution of the electromagnetic field associated with such an optical radiation and outputted from the output 8 can be represented by a plurality of modes, among which the fundamental made has the main energy content while the secondary modes are negligible.

What described up to now relates to the functioning of the laser in continuous wave (CW). In order to directly modulate the optical radiation coming out from the laser of FIG. 1, a modulation current $I_M$, reproducing the shape of the modulating signal, is applied to the laser diode 2 in addition to the current $I_S$.

For example, current $I_S$ can be equal to about 10 mA, while current $I_M$ can be a square-wave signal with amplitude of about 40 mA and a bit rate of 2.5 Gbit/s.

The current IM is for example generated by a bit generator or, in the case the laser is used in a digital transmission system, by a transmitter, and corresponds to an ON-OFF modulating signal having a bit rate equal to 2.5 Gbits/sec.

For this type of modulation current $I_M$, using a Bragg grating similar to that described in the European Patent Application EP-A-0 949 729 and depicted in FIG. 3, curve B, instabilities of the output optical radiation have been experimentally detected. Analysing the spectrum of the output optical radiation of a laser realised in accordance with the teaching of such previous patent application, it can be noted that together with a statistically prevalent percentage of pulses transmitted on the fundamental mode (the peak in correspondence of the desired $\lambda c$ wavelength) a non-negligible percentage of pulses are transmitted on the immediately adjacent secondary oscillation modes. Since transitions between laser oscillation modes causes noise (MJN), it appears that the BER results to be unacceptable.

A possible explanation of this phenomenon can be found in the fact that, in high-frequency direct modulation conditions, the laser does not have enough time to stabilize on the fundamental mode; this phenomenon obviously take place only in direct modulation conditions, while when the laser has to operate in continuous wave, after an initial transient, the laser spontaneously stabilizes on the fundamental mode.

Using a Bragg grating of the type described above, curve A, the secondary modes are instead filtered out by the grating itself, that is they are transmitted towards the output 8 in such a way that they do not resonate inside the laser cavity and are therefore not amplified.

Figure 5:
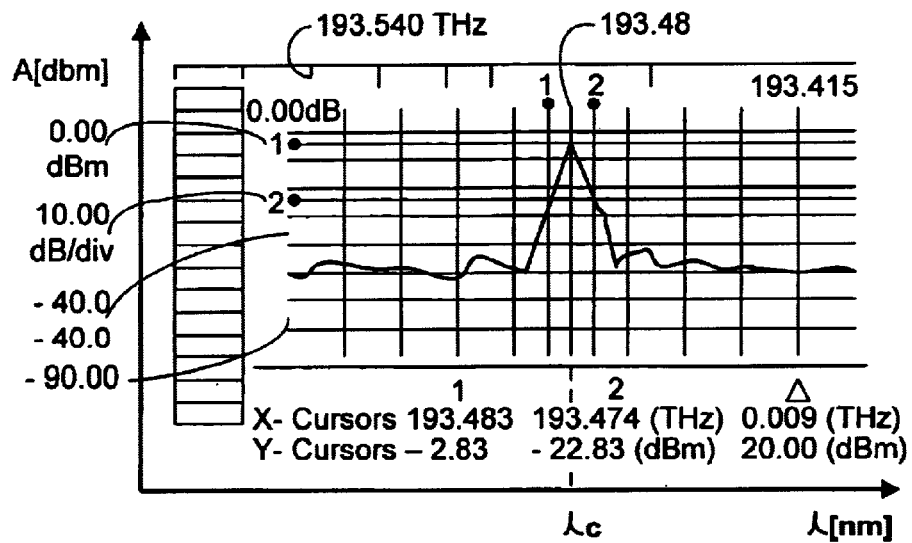
FIGS. 5 and 6 show the main performance features of a laser according to the invention, in particular.

This allows to obtain an output spectrum particularly pure even for high modulation frequencies. For example, in FIG. 5 the output spectrum (amplitude of the output radiation, in dBm, as a function of the wavelength, in nm) of a laser realized in accordance with the invention and in direct modulation conditions at 2.5 Gbits/sec. It can be seen that even the first secondary oscillation modes, adjacent the fundamental mode, are attenuated of at least 50 dB.

Figure 6:
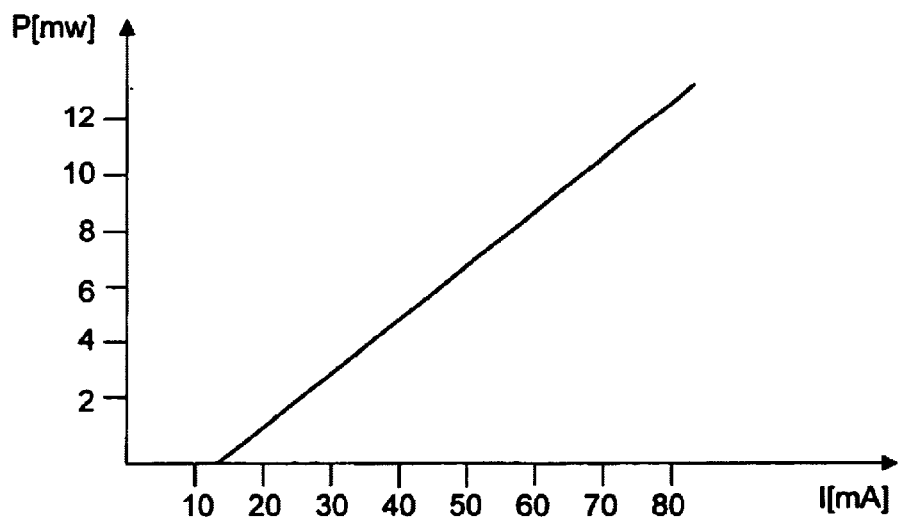

FIG. 6 shows the emitted optical power characteristic as a function of the supply current measured for the laser realised in accordance with the invention. It can be observed that the laser has a linear behaviour.

Figure 4:
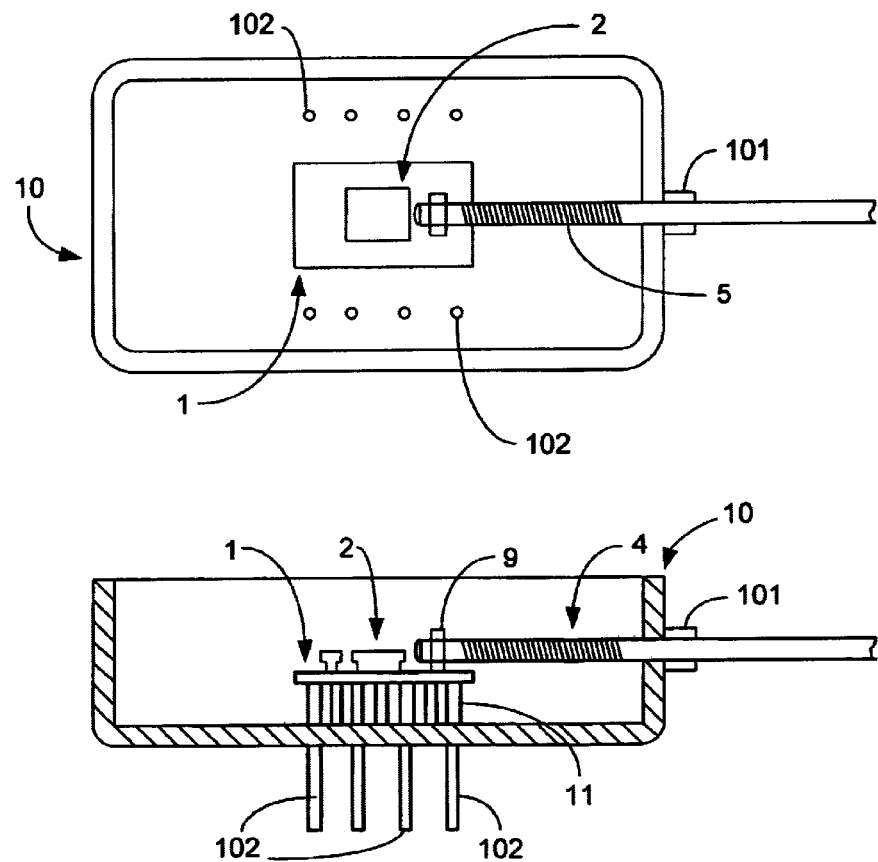
FIG. 4 shows, in plan view and in elevation, cross-sectional view, the laser of FIG. 1 mounted in a package, before closure thereof.

In use, with reference to FIG. 4, the laser of FIG. 1 is expediently placed in a suitable package 10 for example realized in a suitable metal material with good properties of heat dissipation, but scarcely dilatable with increase of temperature, for example in KOVAR. The package 10 is provided with a lateral opening 101 for the passage of an end of the optical fibre 4 and a cover (not shown). The support 1 carrying the laser diode chip 2 and the segment of fibre 4 is mounted inside the package 10 on a peltier cell 11, that works as a regulation element for the temperature of the laser diode and the fibre portion 7 where the Bragg grating is formed; in this way the two critical elements from the thermal drift viewpoint are thermally regulated.

Reophores 102 protrude from the package, the ends thereof internal to the package being electrically connected to electric terminals of the chip 2.

Figure 7:
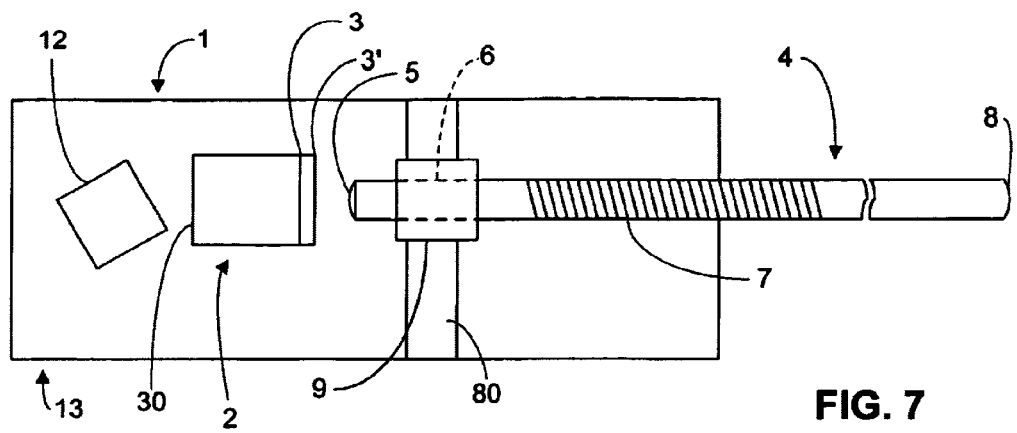
FIG. 7 is a schematic view of a laser according to another possible practical embodiment of the invention.
Figure 8:
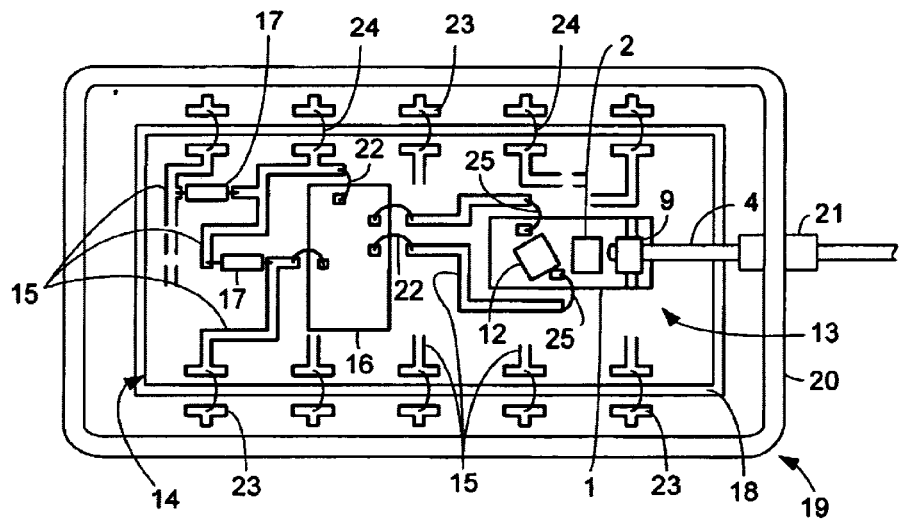
FIGS. 8 and 9 show, in plan view and in elevated cross-sectional view respectively, a transmission module including the laser of FIG. 7.
Figure 9:
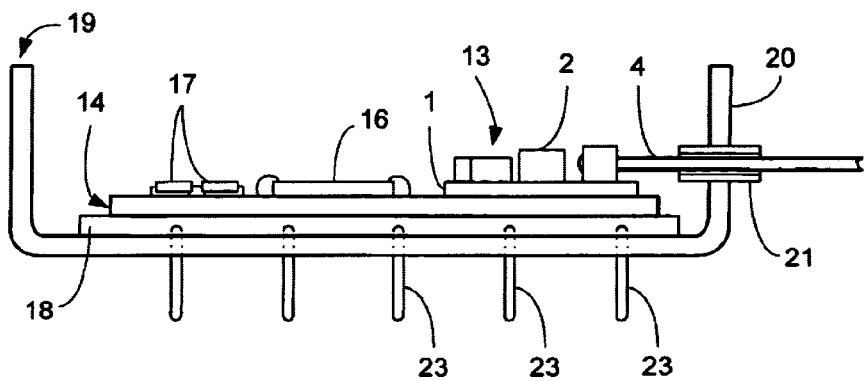

In FIGS. 7, 8 and 9 there is shown a preferred use of the laser according to the present invention in a transmission module of an optical fibre communication system.

In particular, as shown in FIG. 7, the laser of FIG. 1 is preferably completed with a chip 12 wherein, by conventional microelectronic techniques, a photodetector, such as a PIN diode, is integrated with functions of monitoring the laser, for example for controlling the optical power of the radiation emitted by the laser. Chip 12 is attached to the support 1 on which the laser diode chip 2 is also attached, substantially behind the laser diode chip.

The various elements shown in FIG. 7 constitute an optical sub-assembly 13 of the set of elements that compose the transmission module.

In order to form the optical sub-assembly 13, one starts from the support 1 which, as already mentioned, can be for example a silicon die of generically quadrangular shape, for example of square shape with side of 2 mm.

The laser diode chip 2 and the monitor photodetector chip 12 are attached and electrically contacted to the support 1 with conventional techniques, then they are submitted to thermal stress ("Burn-in"). At the end of this phase, selection of the laser is carried out.

The optical fibre, or optical fibre segment, 4 is then attached by soldering to the support 1 in region 9, and it is positioned in such a way as to be optically coupled with the laser diode 2.

Preferably, a functional characterization of the optical sub-assembly 13 thus obtained is carried out.

With reference to FIGS. 8 and 9, the optical sub-assembly 13 will be attached to a substrate 14, for example in alumina, on which a desired layout of electrical connection lines 15 has previously been defined by conventional photolithographic techniques, and on which integrated electronic components 16 and discrete components 17 (resistors, condensers, inductors, thermistors etc.) have been mounted in proper positions. These components form an electronic sub-assembly of the transmission module, for driving and controlling the optical sub-assembly, particularly the laser.

For mounting the components 16 and 17 to the substrate 14, conventional assembling techniques are exploited.

The substrate 14 is in turn attached to a support element 18, on the bottom of a package 19 that will house the transmission module. The package 19 is provided, on one side 20 thereof, with a ferrule 21 working as a passage port for the optical fibre or fibre segment 4. One of the functions of the support element 18 is that of guaranteeing that, once the optical sub-assembly 13 has been assembled to the substrate 14, the height of the optical fibre or fibre segment 4 axis with respect to the package 19 bottom is substantially equal to the height of the axis of the ferrule 21.

The integrated 16 and discrete 17 electronic components previously mounted on the substrate 14 are electrically connected to each other, by means of the lines 15 and conductor wires 22 bonded to the lines 15 and to the components 16, 17, as well as to reophores 23 of the package, by means of further conductor wires 24 bonded to the reophores 23 and to the lines 15. Reophores 23 acts as electrical terminals of the transmission module and are accessible externally of the package 19.

In order to mount the optical sub-assembly 13 to the substrate 14, the optical fibre or fibre segment 4, already attached to the support 1, is inserted and firmly soldered in place inside the ferrule 21. The support 1 of the optical sub-assembly 13 is then attached to the substrate 14 by conventional assembling techniques. The optical sub-assembly 13 is then electrically connected to the electronic sub-assembly by means of conductor wires 25 bonded to the lines 15.

Preferably, after having performed complete functional tests of the transmission module performance, the package is closed by a lid, and the module is finally tested.

An alternative method,differs from the one just described for the fact that the optical fibre or fibre segment 4 is attached to the support 1 of the optical sub-assembly 13 not before, but after the attachment thereof to the substrate 14, and also after the optical sub-assembly 13 has been electrically connected to the lines 15 provided with on the substrate 14. After having carried out these operations, the optical fibre or fibre segment 4 is inserted into the ferrule 21, from outside the package 19. The insertion of the optical fibre or fibre segment in the ferrule is thus made easier compared to the insertion from inside the package, as in the previous embodiment. The optical fibre or fibre segment 4, inserted in the ferrule 21, is aligned with the output of the laser 2 and, after the alignment has been executed, it is stably attached in the correct position by soldering to the region 9 of the support 1. After this, the fibre 4 is fixed inside the ferrule 21.

Compared to conventional assembling techniques, which provide for encapsulating the optical sub-assembly in a respective package and mounting the same on a printed circuit board on which the driving electronic sub-assembly has been formed, the transmission module formed in the way previously described has far better performance, being reduced the effects of parasitic components (such as the package reophores inductances), and it is quite small in dimensions.

It is evident that the present description has been provided by way of non limiting example only, and that variants and modifications can be devised without departing from the scope of protection of the invention defined in the appended claims.

In first place, albeit in the foregoing detailed description reference has been made to a laser diode, the invention is in general applicable to external cavity lasers including an active element comprising a semiconductor optical amplifying cavity, for example a Semiconductor Optical Amplifier (SOA).

Additionally, even though in the description hereby provided reference has always been made to a Bragg grating realized in an optical fibre or fibre segment, it is clear that the invention finds immediate application also in external cavity lasers in which the cavity is formed in any other type of optical waveguide, for example buried guides, ridge guides or integrated guides.

The laser according to the invention can be used in transmitter for digital communication systems, for example but not exclusively in systems adhering to the standards SDH or SONET, or in analogue communication systems.

What is claimed is:

1. An external cavity laser with reflector in optical waveguide, particularly HDBR laser, comprising:
   an active element comprising a semiconductor optical amplifying cavity having a low-reflectivity facet,
   a segment of optical waveguide coupled with said facet and having a termination facing said facet, and
   an external reflector comprising a Bragg grating formed in the optical waveguide segment near the termination,
   wherein said Bragg grating has a symmetric spatial profile of modulation of the refraction index such that a corresponding optical reflectivity spectrum has an optical bandwidth sufficiently small around a prescribed laser oscillation mode wavelength for the laser to oscillate only on said prescribed mode and not on other oscillation modes even in conditions of high-frequency direct modulation.

2. The external cavity laser according to claim 1, in which said prescribed laser oscillation mode is a fundamental mode, said reflectivity amplitude spectrum being such that the laser oscillation modes adjacent said fundamental mode are attenuated of at least 50 dB.

3. The external cavity laser according to claim 2, in which said optical bandwidth at −25 dB is less then approximately 0.5 nm.

4. The external cavity laser according to claim 3, in which the spatial profile of the Bragg grating is of gaussian type ($y \div \exp(x^2)$), or of lorentzian type, or it is a profile defined by the function $y \div \sin^2(x)$.

5. The external cavity laser according to claim 1, in which said grating defines, inside the optical waveguide, an equivalent mirror for the laser radiation, said equivalent mirror being positioned at a distance from the termination of the optical waveguide less than 6 mm, preferably between 5 and 6 mm.

6. The external cavity laser according to claim 1, in which the active element comprises a Semiconductor Optical Amplifier (SOA) with a facet, opposite to said low-reflectivity facet, coated with a reflective coating.

7. The external cavity laser according to claim 1, in which the active element comprises a Fabry-Perot laser.

8. The external cavity laser according to claim 2, in which the Fabry-Perot laser is integrated in a chip which is mounted to a support, the optical waveguide segment being attached to the support by soldering.

9. The external cavity laser according to claim 8, in which for said soldering there is provided an externally metallized portion of the optical guide segment and, in correspondence of a soldering region of the support, a resistive element integrated in the support, in such a way as heat generated by Joule effect by the resistor when powered causes melting of a soldering alloy.

10. The external cavity laser according to claim 8, in which the Fabry-Perot laser integrated in the chip is a junction laser, particularly of GaAs or InP type, or a heterojunction laser, particularly of the InP/InGaAsP type.

11. The external cavity laser according to claim 9, in which the Fabry-Perot laser integrated in the chip is a junction laser, particularly of GaAs or InP type, or a heterojunction laser, particularly of the InP/InGaAsP type.

12. A transmission module for an optical communication system, comprising an external cavity laser with reflector in optical waveguide, particularly HDBR laser, the external cavity laser comprising:
   an active element comprising a semiconductor optical amplifying cavity having a low-reflectivity facet,
   a segment of optical waveguide coupled with said facet and having a termination facing said facet, and
   an external reflector comprising a Bragg grating formed in the optical waveguide segment near the termination,
   wherein said Bragg grating has a symmetric spatial profile of modulation of the refraction index such that a corresponding optical reflectivity spectrum has an optical bandwidth sufficiently small around a prescribed laser oscillation mode wavelength for the laser to oscillate only on said prescribed mode and not on other oscillation modes even in conditions of high-frequency direct modulation.

13. The transmission module according to claim 12, in which the laser is part of an optical sub-assembly formed on a support die, particularly in silicon, said support die being mechanically and electrically mounted directly on a substrate in which an electronic sub-assembly is realized for driving the laser, said substrate being encapsulated in a package.

14. An optical communication system comprising a transmission module, the transmission module comprising: an external cavity laser with reflector in optical waveguide, particularly HDBR laser, the external cavity laser comprising:
   an active element comprising a semiconductor optical amplifying cavity having a low-reflectivity facet,
   a segment of optical waveguide coupled with said facet and having a termination facing said facet, and
   an external reflector comprising a Bragg grating formed in the optical waveguide segment near the termination,
   wherein said Bragg grating has a symmetric spatial profile of modulation of the refraction index such that a corresponding optical reflectivity spectrum has an optical bandwidth sufficiently small around a prescribed laser oscillation mode wavelength for the laser to oscillate only on said prescribed mode and not on other oscillation modes even in conditions of high-frequency direct modulation.

15. The optical communication system according to claim 14 in which the laser is part of an optical subassembly formed on a support die, particularly in silicon, said support die being mechanically and electrically mounted directly on a substrate in which an electronic sub-assembly is realized for driving the laser, said substrate being encapsulated in a package.

16. An external cavity laser with reflector in optical waveguide, particularly HDBR laser, comprising:
   an active element comprising a semiconductor optical amplifying cavity having a low-reflectivity facet, a segment of optical waveguide coupled with said facet and having a termination facing said facet, and an external reflector comprising a reflecting grating formed in the optical waveguide segment near the termination, wherein said reflecting grating has a corresponding optical reflectivity spectrum with an optical bandwidth sufficiently small around a prescribed laser oscillation mode wavelength for the laser to oscillate only on said prescribed mode and not on other oscillation modes even in conditions of high-frequency direct modulation.

* * * * *